(12) United States Patent
Horiuchi et al.

(10) Patent No.: US 8,664,764 B2
(45) Date of Patent: Mar. 4, 2014

(54) SEMICONDUCTOR DEVICE INCLUDING A CORE SUBSTRATE AND A SEMICONDUCTOR ELEMENT

(75) Inventors: Michio Horiuchi, Nagano (JP); Yasue Tokutake, Nagano (JP); Yuichi Matsuda, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 13/493,123

(22) Filed: Jun. 11, 2012

(65) Prior Publication Data

US 2012/0313245 A1 Dec. 13, 2012

(30) Foreign Application Priority Data

Jun. 13, 2011 (JP) .................................. 2011-131251

(51) Int. Cl.
*H01L 23/48* (2006.01)
*H01L 23/52* (2006.01)
*H01L 29/40* (2006.01)

(52) U.S. Cl.
USPC ............................. 257/758; 257/698; 257/712

(58) Field of Classification Search
USPC ........................... 257/698, 712, E23.101, 758
See application file for complete search history.

(56) References Cited

U.S. PATENT DOCUMENTS

| 6,392,301 | B1 * | 5/2002 | Waizman et al. | 257/774 |
| 6,469,374 | B1 * | 10/2002 | Imoto | 257/686 |
| 8,193,092 | B2 * | 6/2012 | Pratt | 438/667 |
| 2009/0072384 | A1 * | 3/2009 | Wong et al. | 257/712 |
| 2010/0078786 | A1 * | 4/2010 | Maeda | 257/678 |
| 2010/0307808 | A1 * | 12/2010 | Horiuchi et al. | 174/264 |
| 2010/0320594 | A1 * | 12/2010 | Yamano | 257/693 |
| 2012/0147592 | A1 * | 6/2012 | Takase | 362/97.1 |

FOREIGN PATENT DOCUMENTS

| JP | 2011-023626 | | 2/2011 | |
| WO | WO 2011027588 | A1 * | 3/2011 | ............... F21S 2/00 |

* cited by examiner

*Primary Examiner* — Phuc Dang
(74) *Attorney, Agent, or Firm* — Rankin, Hill & Clark LLP

(57) ABSTRACT

One embodiment provides a semiconductor device having: a core substrate having first and second surfaces and an accommodation hole penetrating therethrough; a semiconductor element accommodated in the accommodation hole so that a front surface thereof is on the first surface side; a first metal film formed on a back surface of the semiconductor element; a second metal film formed on the second surface of the core substrate; an insulating layer covering the first and second metal films; and a third metal film formed on the insulating layer, via parts thereof penetrating through the insulating layer to respectively reach the first and second metal films.

17 Claims, 15 Drawing Sheets

1A

SEMICONDUCTOR DEVICE INCLUDING A CORE SUBSTRATE AND A SEMICONDUCTOR ELEMENT

CROSS-REFERENCE TO RELATED APPLICATION(S)

This application claims priority/priorities from Japanese Patent Application No. 2011-131251 filed on Jun. 13, 2011, the entire contents of which are incorporated herein by reference.

FIELD

The present invention relates to a semiconductor device which is configured so as to include semiconductor elements and a substrate.

BACKGROUND

Semiconductor devices are known in which semiconductor elements are accommodated in a wiring substrate. For example, the wiring substrate is configured such that plural conductive layers and plural insulating layers are laid alternately on a silicon substrate body and adjoining conductive layers are connected to each other by via holes that penetrate through the insulating layer sandwiched between the adjoining conductive layers. Example materials of the substrate body other than silicon are a metal and a resin. An insulative substrate which is formed with a number of through-holes filled with a metal material may also be used.

Generally, in such semiconductor devices, no heat dissipation path from the back surface of each semiconductor element is provided (for example, see JP-2011-023626-A). Thus, a heat sink or a spreader may be bonded to the back surface of each semiconductor element.

However, in the structure having no heat dissipation path from the back surface of each semiconductor element, it is difficult to keep the element temperature of each semiconductor element lower than a required temperature. On the other hand, a provision of a heat sink or a spreader to the back surface of each semiconductor element lowers the mounting density when semiconductor elements (and other semiconductor devices) are mounted in the semiconductor device.

SUMMARY

One aspect of the present invention provides a semiconductor device including: a core substrate having a first surface and a second surface, a semiconductor element accommodation hole penetrating through the core substrate between the first surface and the second surface; a semiconductor element accommodated in the semiconductor element accommodation hole so that a circuit formation surface thereof is on the first surface side; a first metal film formed on a back surface of the semiconductor element, the back surface being opposite to the circuit formation surface: a second metal film formed on the second surface of the core substrate; an insulating layer formed to cover the first metal film and the second metal film; and a third metal film formed on the insulating layer, the third metal film having via parts that penetrate through the insulating layer and respectively reach the first metal film and the second metal film to thereby connect the first metal film and the second metal film.

Another aspect of the present invention provides a semiconductor device including: a core substrate having a first surface and a second surface, a semiconductor element accommodation hole penetrating through the core substrate between the first surface and the second surface; a semiconductor element accommodated in the semiconductor element accommodation hole so that a circuit formation surface thereof is on the first surface side; a first metal film formed on a back surface of the semiconductor element, the back surface being opposite to the circuit formation surface: a second metal film formed on the second surface of the core substrate; and an insulating layer formed to cover the first metal film and the second metal film, wherein the first metal film and the second metal film are integrally formed with each other.

The disclosed techniques provide a semiconductor device which is enhanced in heat dissipation without a reduction in mounting density.

DETAILED DESCRIPTION

Figure 1:
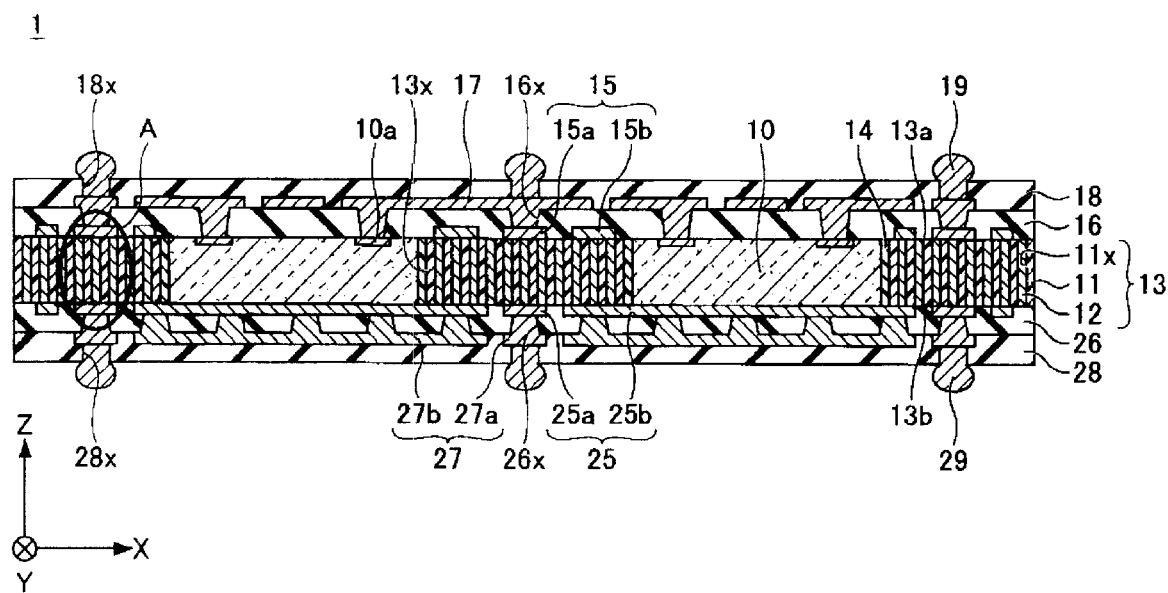
FIG. 1 cross-sectionally illustrates a semiconductor device according to a first embodiment.

Embodiments will be hereinafter described with reference to the drawings. The same constituent members etc. will be given the same reference symbol in the drawings and may not be described redundantly.

First Embodiment

Configuration of Semiconductor Device According to First Embodiment

Figure 2:
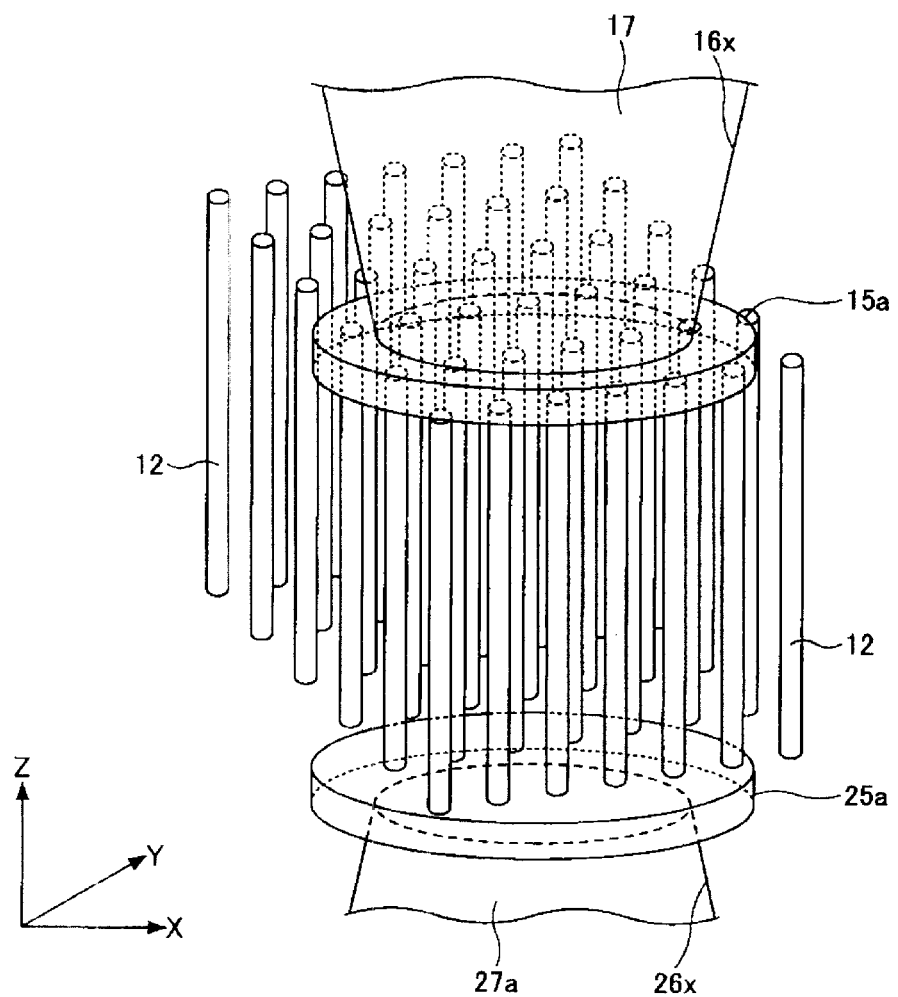
FIG. 2 illustrates the part A in FIG. 1 in a seethrough manner.

FIG. 1 cross-sectionally illustrates the semiconductor device 1 according to the first embodiment. FIG. 2 enlargedly illustrates the part A in FIG. 1 in a seethrough manner. In FIG. 2, part of the constituent members etc. are omitted. In FIGS. 1 and 2, the X direction is defined to be parallel with one surface 13a of a core substrate 13 (i.e., the extending direction of the core substrate 13), the Y direction is defined to be perpendicular to the X direction (the imaginary depth direction of FIG. 1), and the Z direction is defined to be perpendicular to the X direction and the Y direction (i.e., the thickness direction of the core substrate 13). These definitions also apply to the other drawings.

As shown in FIGS. 1 and 2, the semiconductor device 1 according to the first embodiment has semiconductor elements 10, the core substrate 13, insulative resins 14, a metal film 15, an insulating layer 16, a metal film 17, a solder resist layer 18, solder bumps 19, a metal film 25, an insulating layer 26, a metal film 27, a solder resist layer 28, and solder bumps 29.

The core substrate 13 measures, for example, about 70 to 100 μm in thickness and about 30 mm×30 mm in size. In the core substrate 13, many through-holes 11x are formed over the entire substrate body 11 in the Z direction (thickness direction), and linear conductors (vias) 12 formed of a metal material are filled in the through-holes 11x. Through-holes (semiconductor element accommodation holes) 13x are formed in the core substrate 13 to penetrate therethrough from the one surface 13 to the other surface 13b, so that the respective semiconductor elements 10 are accommodated therein.

The substrate body 11 may be made of an insulative material including an inorganic dielectric such as alumina (aluminum oxide), mullite, aluminum nitride, glass ceramics (a composite material of glass and ceramics), barium strontium titanate, barium titanate, strontium titanate, or lead titanate zirconate.

The semiconductor elements 10 accommodated in the core substrate 13 are made of, for example, silicon semiconductor elements, and their thermal expansion coefficient is about 3 ppm/° C. On the other hand, the metal films 15, 17, etc. formed on the surfaces of the core substrate 13 are made of, for example, copper (Cu), and their thermal expansion coefficient is about 16 to 17 ppm/° C. In order to reduce stress between the semiconductor elements 10 and the metal films 15, 17, etc. caused by the difference in their thermal expansion coefficients, for example, ceramics or the like having an intermediate thermal expansion coefficient may be employed as the material of the substrate body 11. For example, as alumina (expansion coefficient: about 6 to 7 ppm/° C.) or mullite (expansion coefficient: about 4.5 ppm/° C.) may be used.

In the core substrate 13, one end face of each linear conductor 12 is exposed in the one surface 13a while the other end face is exposed in the other surface 13b. The linear conductors 12 are formed approximately parallel with each other approximately at regular intervals over almost the entire area of the substrate body 11. Each linear conductor 12 may be circular in a plan view and about 30 to 2,000 nm in diameter. The term "plan view" means a view seen from the Z direction in FIG. 1. Preferably, the linear conductors 12 may be formed so densely that the interval between adjoining linear conductors 12 is smaller than their diameter. However, no particular limitations are imposed on the arrangement form of the linear conductors 12; they may be arranged in hexagonal form or grid form.

Each linear conductor 12 functions as a via for connecting a conductor formed on the one surface 13a and a conductor formed on the other surface 13b. However, not every linear conductor 12 may be connected with such conductor, and the liner conductor 12 connected with no conductor may be in an electrically floating state. Example metal materials of the linear conductors (vias) 12 are silver (Ag), copper (Cu), and nickel (Ni).

In each semiconductor element 10, a semiconductor integrated circuit (not shown) and electrode pads 10a are formed on a thin semiconductor substrate (not shown) made of silicon or the like. Each semiconductor element 10 is accommodated in the through-hole 13x of the core substrate 13 via an insulative resin 14 such that its circuit formation surface (i.e. the surface on which the semiconductor integrated circuit and the electrode pads 10a are formed) faces the surface 13a of the core substrate 13. An insulating film made of silicon dioxide ($SiO_2$), silicon nitride (SiN), or the like may be formed on portions, including the back surface (i.e., the surface opposite to the circuit formation suffice), of each semiconductor element 10. For example, each semiconductor element 10 may be 10 to 50 μm in thickness. The material of the insulative resin 14 may be an epoxy resin or a polyimide resin.

Figure 3:
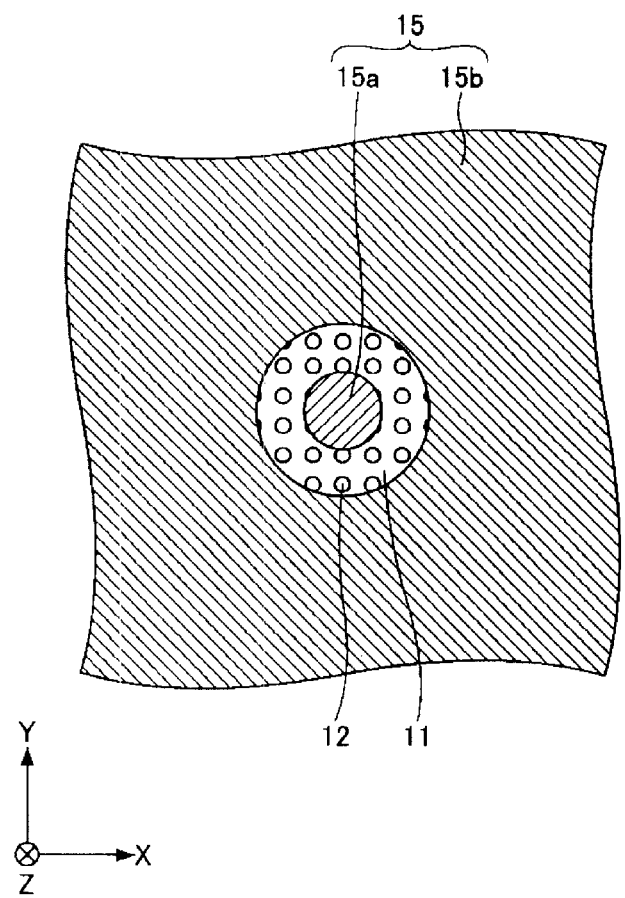
FIG. 3 partially illustrates from above the semiconductor device according to the first embodiment.

The metal film 15 is formed on the surface 13a of the core substrate 13 to have prescribed planar patterns, while it is not formed on the circuit formation surfaces of the semiconductor elements 10. The metal film 15 has signal metal films 15a which serve as signal flow paths and a radiation metal film 15b which serves as a heat radiation path. As shown in FIG. 3, the radiation metal film 15b is formed to surround the signal metal films 15a. In FIG. 3, only the substrate body 11 (including the linear conductors 12) and the metal film 15 are illustrated. In FIG. 3, for the sake of convenience, the signal metal film 15a and the radiation metal film 15b are hatched as in FIG. 1.

The radiation metal film 15b may be electrically connected to a reference voltage of the semiconductor device 1. The signal metal films 15a and the radiation metal film 15b are connected to the exposed end faces of the linear conductors 12 respectively at the surface 13a of the core substrate 13. An example material of the metal film 15 (signal metal films 15a and radiation metal film 15b) is copper (Cu). The radiation metal film 15b functions as "fourth metal film".

The insulating layer 16 is formed so as to cover the metal film 15 formed on the surface 13a of the core substrate 13 and the circuit formation surfaces of the semiconductor elements 10. The material of the insulating layer 16 may be a resin such as an epoxy resin or a polyimide resin.

The metal film 17 includes via parts formed to fill respective via holes 16x in the insulating layer 16 and wiring parts formed on the insulating film 16 to have prescribed planar patterns. The via holes 16x are truncated-cone-shaped through-holes which are wider on the solder resist layer 18 side, and reach the metal film 15 or the electrode pads 10a. The metal film 17 is electrically connected to the signal metal film 15a and the electrode pads 10a through the via holes 16x. An example material of the metal film 17 is copper (Cu).

The solder resist layer 18 is formed on the insulating layer 16 so as to cover the metal film 17, while exposing portions of the metal film 17 through openings 18x. To increase the reliability of connections, metal films (not shown) may be formed on the exposed portions of the metal film 17 by electroless plating, for example. Examples of each of those metal films are an Au film, an Ni/Au film formed by laying an Ni film and an Au film in this order, and an Ni/Pd/Au film formed by laying an Ni film, a Pd film, and an Au film in this order. Instead of forming metal films, OSP (organic solderability preservative) processing may be performed on the exposed portions of the metal film 17.

The solder bumps 19 are formed on the exposed portions of the metal film 17 as external connection terminals for connection to another semiconductor device, a mounting board, or the like. Example materials of the solder bumps 19 are an alloy containing Pb, an alloy of Sn and Cu, an alloy of Sn and Ag, and an alloy of Sn, Ag, and Cu.

Instead of the solder bumps 19, metal pins, for example, may be used as external connection terminals. The solder bumps 19, metal pins, or the like to serve as external connection terminals may be omitted. Such external connection terminals may be formed as necessary after the semiconductor device 1 has been manufactured.

The metal film 25 is formed on the back surfaces of the semiconductor elements 10 and the surface 13b of the core substrate 13 to have prescribed planar patterns. The metal film 25 has signal metal films 25a which serve as signal flow paths and a radiation metal film 25b which serves as a heat radiation path. Like the radiation metal film 15b shown in FIG. 3, the radiation metal film 25b is formed to surround the signal metal films 25a.

Here, while the radiation metal film 15b is formed only on the surface 13a of the core substrate 13, the radiation metal film 25b is formed continuously/integrally on the back surfaces of the semiconductor elements 10 and on the surface 13b of the core substrate 13 which are approximately flush with each other. The portions of the radiation metal film 25b formed on the back surfaces of the semiconductor elements 10 function as "first metal film", while the portion of the radiation metal film 25b formed on the surface 13b of the core substrate 13 functions as "second metal film".

The radiation metal film 25b may be electrically connected to the reference voltage of the semiconductor device 1. The signal metal films 25a and the radiation metal film 25b are connected to the exposed end faces of the linear conductors 12 at the surface 13b of the core substrate 13. That is, each signal metal film 25a is electrically connected to the corresponding signal metal film 15a by the linear conductors 12. The radiation metal film 25b is electrically connected to the radiation metal film 15b by the linear conductors 12. An example material of the metal film 25 (signal metal films 25a and radiation metal film 25b) is copper (Cu).

When the radiation metal film 15b or the radiation metal film 25b is electrically connected to the reference voltage (GND), an advantage as in a coaxial line can be realized. That is, the signal metal films 15a and 25a and the linear conductors 12 connecting them are surrounded by the radiation metal films 15b and 25b (at least one of which is electrically connected to the reference voltage (GND)) and the linear conductors 12 connecting them, with a prescribed gap. Thus, the signal metal films 15a and 25a (through which a signal current flows) and the linear conductors 12 connecting them can be shielded from external noise.

Also, the signal metal films 15a and 25a and the linear conductors 12 can be prevented from becoming a noise source.

The insulating layer 26 is formed so as to cover the portions of the metal film 25 formed on the surface 13b of the core substrate 13 and the portions of the metal film 25 formed on the back surfaces of the semiconductor elements 10, as an "insulating layer". The material of the insulating layer 26 may be a resin such as an epoxy resin or a polyimide resin.

The metal film 27 includes via parts formed to fill respective via holes 26x in the insulating layer 26 and wiring parts formed on the insulating film 26 to have prescribed planar patterns. The via holes 26x are truncated-cone-shaped through-holes which are wider on the solder resist layer 28 side and reach the metal film 25.

The metal film 27 has signal metal films 27a which serve as signal flow paths and a radiation metal film 27b which serves as a heat radiation path. Like the radiation metal film 15b shown in FIG. 3, the radiation metal film 27b is formed to surround the signal metal films 27a. The signal metal films 27a may be formed so as to coextend with the respective signal metal films 25a, and the radiation metal film 27b may be formed so as to coextend with the radiation metal film 25b.

The radiation metal film 27b may be electrically connected to the reference voltage of the semiconductor device 1. The signal metal films 27a are electrically connected to the signal metal films 25a through the via holes 26x, respectively. The radiation metal film 27b is electrically connected to the radiation metal film 25b through the associated via holes 26x. An example material of the metal film 27 (signal metal films 27a and radiation metal film 27b) is copper (Cu). The wiring part of the radiation metal film 27b functions as "third metal film", while the via parts of the radiation metal film 27b function as "via parts".

The solder resist layer 28 is formed on the insulating layer 26 so as to cover the metal film 27, while exposing portions of the signal metal films 27a through openings 28x. To increase the reliability of connections, metal films (not shown) may be formed on the exposed portions of the signal metal films 27a by electroless plating, for example. Examples of each of those metal films are an Au film, an Ni/Au film formed by laying an Ni film and an Au film in this order, and an Ni/Pd/Au film formed by laying an Ni film, a Pd film, and an Au film in this order. Instead of forming metal films, OSP (organic solderability preservative) processing may be performed on the exposed portions of the signal metal films 27a.

The solder bumps 29 are formed on the exposed portions of the signal metal films 27a as external connection terminals for connection to another semiconductor device, a mounting board, or the like. Example materials of the solder bumps 29 are an alloy containing Pb, an alloy of Sn and Cu, an alloy of Sn and Ag, and an alloy of Sn, Ag, and Cu.

Instead of the solder bumps 29, metal pins, for example, may be used as external connection terminals. The solder bumps 29, metal pins, or the like to serve as external connection terminals may be omitted. Such external connection terminals may be formed as necessary after the semiconductor device 1 has been manufactured.

As described above, the radiation metal film 25b of the metal film 25 is formed continuously/integrally on the back surfaces of the semiconductor elements 10 and on the surface 13b of the core substrate 13 which are approximately flush each other, and the radiation metal film 25b is connected to the radiation metal film 27b by the via parts of the metal film 27 that penetrate through the insulating layer 26. Furthermore, the part of the radiation metal film 25b formed on the surface 13b is connected to the part of the radiation metal film 15b formed on the surface 13a by the linear conductors 12.

As a result, heat that is generated by each semiconductor element 10 during its operation is transmitted from the radiation metal film 25b to the radiation metal film 27b via the via parts of the metal film 27 and also to the radiation metal film 15b via the linear conductors 12. That is, the heat is diffused to and radiated from the entire semiconductor device 1, whereby the element temperature of each semiconductor element 10 can be kept low. In particular, the linear conductors 12 which are formed through the core substrate 13 in its thickness direction at very small intervals cover almost the entire area of the core substrate 13, whereby the heat diffusion and the heat dissipation can be enhanced greatly.

Manufacturing Method of Semiconductor Device According to First Embodiment

FIGS. 4-11 illustrate a manufacturing process of the semiconductor device 1 according to the first embodiment.

Figure 4:
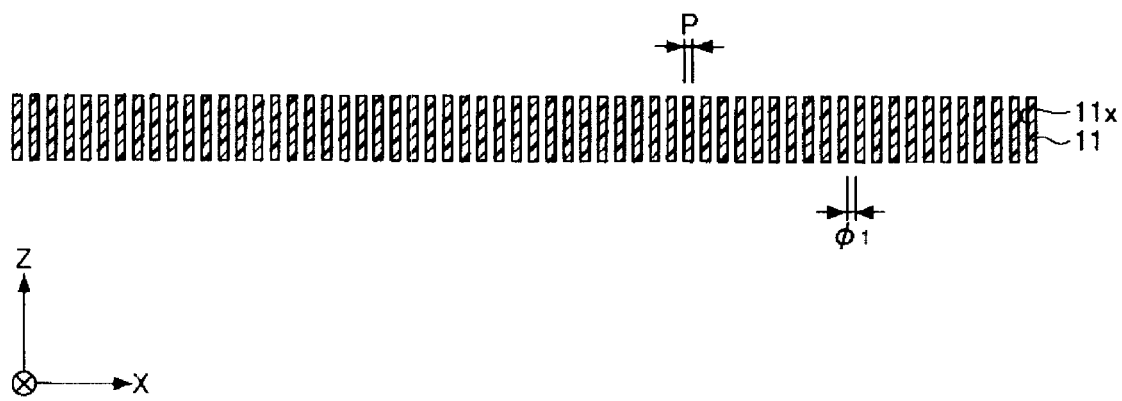
FIGS. 4 to 11 illustrate a manufacturing process of the semiconductor device according to the first embodiment.

First, in a manufacturing step shown in FIG. 4, a substrate body 11 is prepared and a large number of through-holes 11x are formed through the substrate body 11 in its thickness direction over the entire area thereof. The substrate body 11 may be an alumina (aluminum oxide) green sheet which is about 70 to 100 μm in thickness and about 30 mm×30 mm in size. Each through-hole 11x may be circular in a plan view and about 30 to 2.000 nm in diameter $\phi_1$. Preferably, the through-holes 11x may be formed densely so that the interval P between adjoining through-holes 11x is smaller than the diameter $\phi_1$. However, no particular limitations are imposed on the arrangement form of the through-holes 11x; they may be arranged in hexagonal form or grid form.

The through-holes 11x can be formed by anodic oxidation, for example. More specifically, an aluminum (Al) substrate one surface of which is coated with an insulating layer, or a glass substrate on which an Al electrode layer is formed by sputtering or the like is prepared. After its surface is cleaned, the thus-prepared Al substrate or Al electrode layer is immersed in an electrolytic solution (preferably an aqueous solution of sulfuric acid). A pulse voltage is applied between the Al substrate or Al electrode layer (anode) and a platinum (Pt) electrode (cathode) which is opposed to the former, whereby a porous metal oxide film (an aluminum oxide film in which holes having very small diameters are formed regularly) is formed on the surface of the Al substrate or Al electrode layer.

Then, a voltage that is opposite in polarity to the voltage used in the anodic oxidation is applied between the Al substrate or Al electrode layer (cathode) and the platinum electrode (anode), whereby the porous metal oxide film is separated from the Al substrate or Al electrode layer. As a result, a desired substrate body 11 in which through-holes 11x having very small diameters (e.g., about 30 to 2,000 nm) are formed at a high density is obtained.

Example materials, other than alumina (aluminum oxide), of the substrate body 11 are insulative materials such as mullite, aluminum nitride, glass ceramics (a composite material of glass and ceramics), barium strontium titanate, barium titanate, strontium titanate, and lead titanate zirconate.

Figure 5:
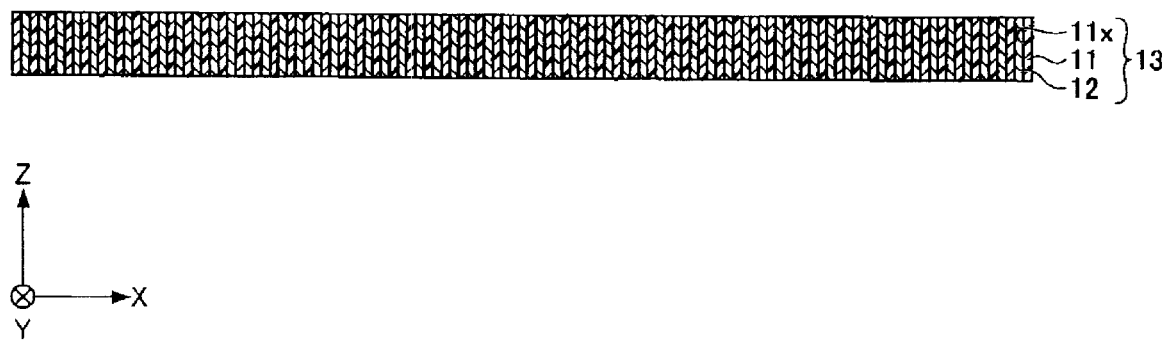

In a manufacturing step of FIG. 5, linear conductors (vias) 12 are formed by tilling the through-holes 11x of the substrate body 11 with a metal material. In the following description, the substrate body 11 having the linear conductors 12 may be referred to as a core substrate 13. The linear conductors 12 can be formed by filling the through-holes 11x with a conductive paste made of silver (Ag), copper (Cu), or the like by screen printing, ink jetting, or the like.

When copper, for example, is used as a metal material, a seed layer is formed on the surfaces (including the inner surfaces of the through-holes 11x) of the substrate body 11 by electroless copper plating and the through-holes 11x are filled with copper by electrolytic copper plating using the seed layers as electricity supply layers. Alternatively, the through-holes 11x may be filled with copper only by electroless copper plating.

If necessary, both end faces of each linear conductor 12 are exposed by planarizing both surfaces of the plated substrate body 11 by mechanical polishing, chemical mechanical polishing (CMP), or the like. As a result, a structure (see FIG. 2) in which the very-small-diameter linear conductors 12 are densely formed in the substrate body 11 can be formed.

Figure 6:
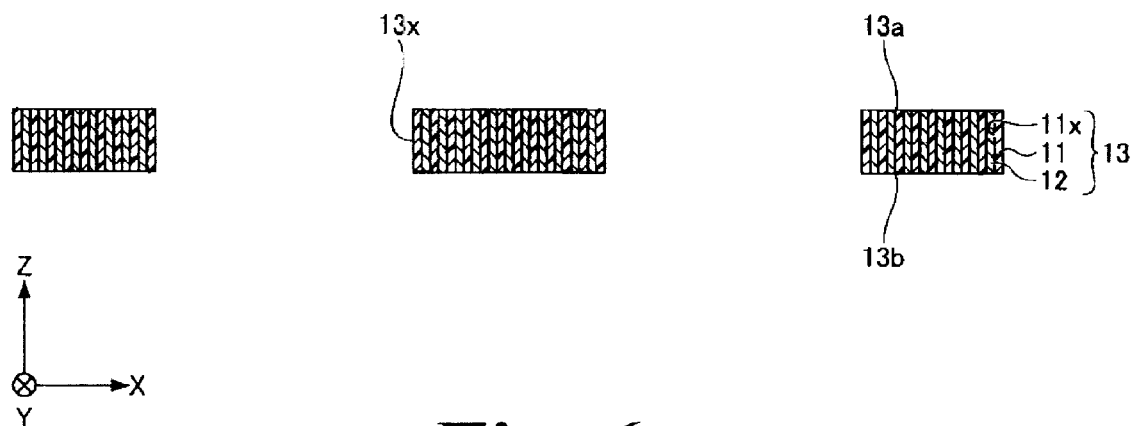

In a manufacturing step of FIG. 6, plural through-holes (semiconductor element accommodation holes) 13x are formed in the core substrate 13 to penetrate therethrough. Semiconductor elements 10 are accommodated in the through-holes 13x, in a later manufacturing step of FIG. 8. The shapes of the through-holes 13x are determined correspondingly with the shapes of the semiconductor elements 10; for example, the through-holes 13x are made approximately rectangular in a plan view. The through-holes 13x may be formed by laser processing, wet etching, or the like.

Figure 7:
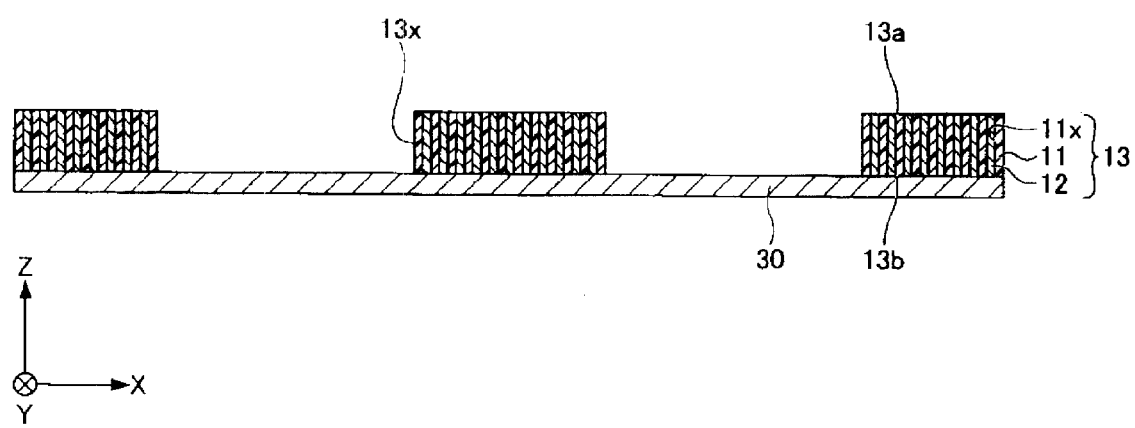

In a manufacturing step of FIG. 7, a support body 30 is formed on a surface 13b of the core substrate 13 so as to close one ends of the respective through-holes 13x. The support body 30 may be a metal plate or be made of a resin material such as an epoxy resin. The support body 30 may be bonded to the surface 13b of the core substrate 13 with a double-sided adhesive member.

Figure 8:
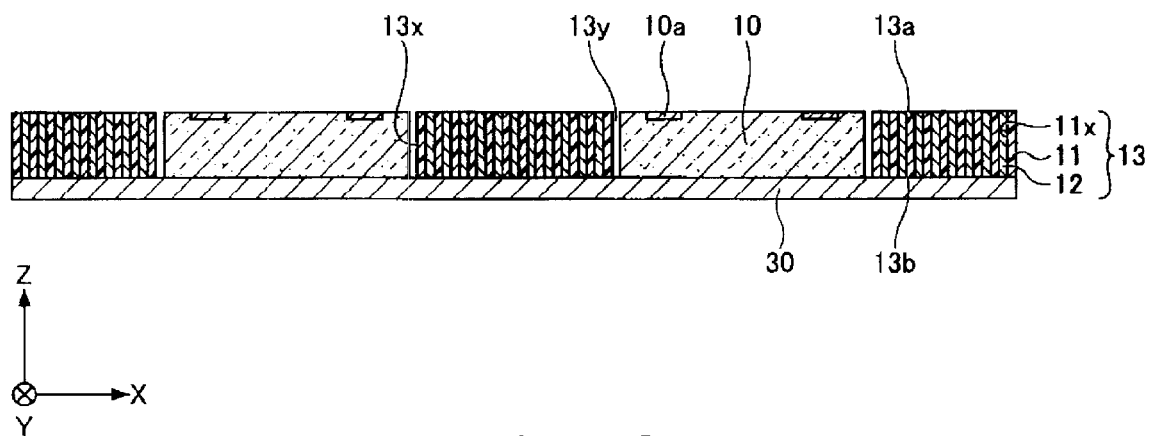

In a manufacturing step of FIG. 8, semiconductor elements 10 are put into the respective through-holes 13x one by one so that, for example, the back surfaces of the semiconductor elements 10 come into contact with the support body 30. Each semiconductor element 10 is placed so that gaps 13y are formed between its side surfaces and the inner surfaces of the associated through-hole 13x. The thickness of the semiconductor elements 10 (excluding their electrode pads 10a) may be about 10 to 50 μm. The semiconductor elements 10 may be approximately as thick as or a little thicker than the core substrate 13 (e.g., about 70 to 100 μm). In each semiconductor element 10, a semiconductor integrated circuit (not shown) and electrode pads 10a are formed on a thin semiconductor substrate (not shown) made of silicon or the like.

Figure 9:
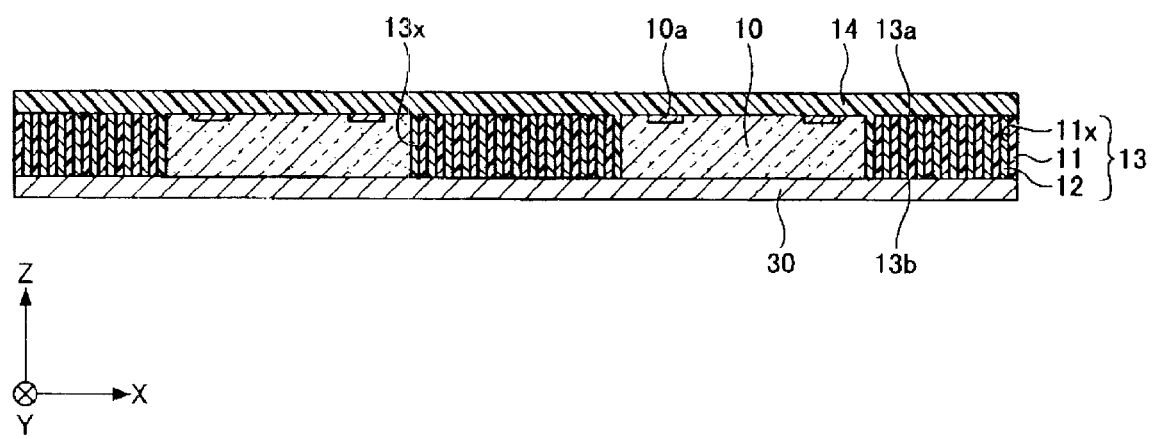

In a manufacturing step of FIG. 9, an insulative resin (epoxy resin, polyimide resin, or the like) 14 is inserted into the gaps 13y (see FIG. 8) and applied to the surface 13a of the core substrate 13, whereby the semiconductor elements 10 are fixedly set in the respective through-holes 13x. Preferably, the insulative resin 14 may be made of a resin material having superior space filling performance, rather than thickness uniformity and workability.

Figure 10:
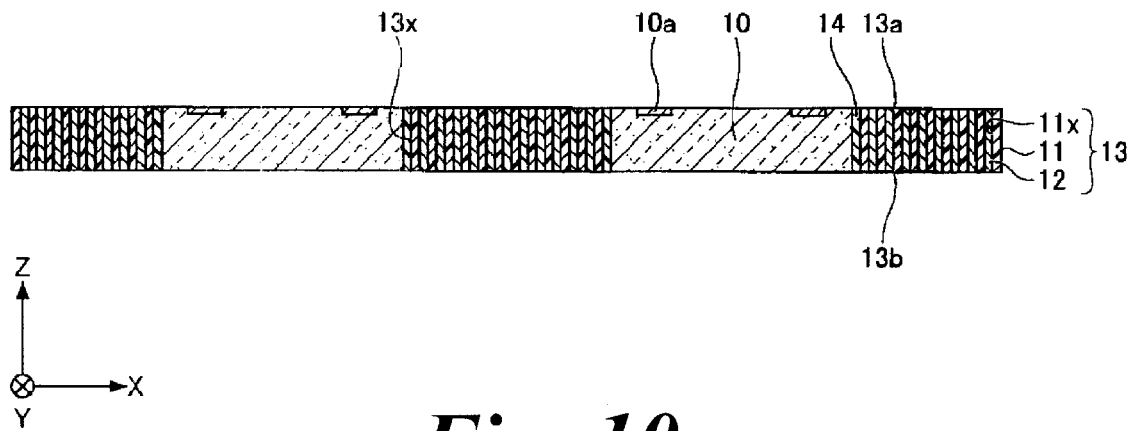

In a manufacturing step of FIG. 10, the insulative resin 14 is removed by mechanical polishing, chemical mechanical polishing (CMP), or the like, whereby the surface 13a of the core substrate 13 is exposed. Then, the support body 30 is removed. The support body 30 may be peeled off mechanically or etched away (in the case where it is made of a metal). As a result, the surface 13a of the core substrate 13 is made approximately flush with the circuit formation surfaces of the semiconductor elements 10. And, the surface 13b of the core substrate 13 is made approximately flush with the back surfaces of the semiconductor elements 10.

Figure 11:
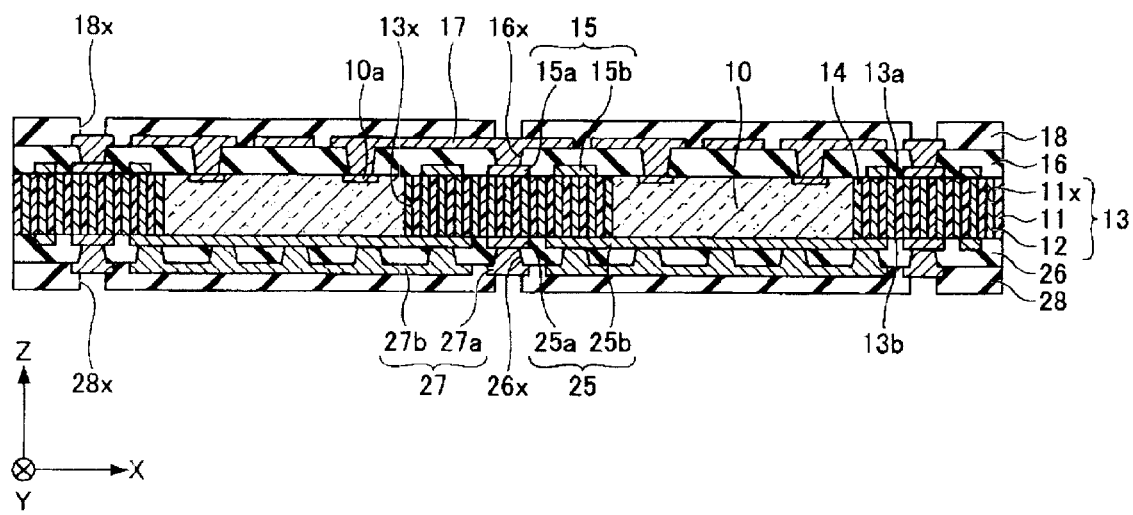

Finally, in a manufacturing step of FIG. 11, a metal film 15, an insulating layer 16, a metal film 17, and a solder resist layer 18 are laid sequentially on the surface 13a of the core substrate 13 and a metal film 25, an insulating layer 26, a metal film 27, and a solder resist layer 28 are laid sequentially on the surface 13b of the core substrate 13. Specific example steps will be described below.

First, a metal film 15 (signal metal films 15a and radiation metal film 15b) is formed on the surface 13a of the core substrate 13, and not formed on the circuit formation surfaces of the semiconductor elements 10. As shown in FIG. 3, the radiation metal film 15b is formed to surround the signal metal films 15a. The radiation metal film 15b may be electrically connected to a reference voltage of the semiconductor device 1.

A metal film 25 (signal metal films 25a and radiation metal film 25b) is formed on the back surfaces of the semiconductor elements 10 and the surface 13b of the core substrate 13. Like the radiation metal film 15b shown in FIG. 3, the radiation metal film 25b is formed to surround the signal metal films 25a. Here, while the radiation metal film 15b is formed only on the surface 13a of the core substrate 13, the radiation metal film 25b is formed continuously/integrally on the back surfaces of the semiconductor elements 10 and on the surface 13b of the core substrate 13 which are approximately flush with each other. The radiation metal film 25b may be electrically connected to the reference voltage of the semiconductor device 1.

The metal films 15 and 25 may be formed by sputtering or plating. An example material of the metal films 15 and 25 is copper (Cu). Each signal metal film 15a is electrically connected to the corresponding signal metal film 25a by the linear conductors 12. The radiation metal film 15b is connected to the radiation metal film 25b by the linear conductors 12.

Then, an insulating layer 16 is formed on the surface 13a of the core substrate 13 so as to cover the metal film 15. And, an insulating layer 26 is formed on the surface 13b of the core substrate 13 so as to cover the metal film 25. The material of the insulating layers 16 and 26 may be a resin such as an epoxy resin or a polyimide resin. For example, the insulating layers 16 and 26 are formed by laying resin films to covet the respective metal films 15 and 25, pressing the resin films, and setting the resin films by performing heat treatment at about 190° C. Instead of laying resin films, liquid or paste resin may be applied by spin coating or the like.

Then, via holes 16x are formed through the insulating layer 16 by laser processing or the like so as to expose portions of the metal film 15 and portion of the electrode pads 10a. And, via holes 26x are formed through the insulating layer 26 by laser processing or the like so as to expose portions of the metal film 25. For example, a $CO_2$ laser can be used for the laser processing. Alternatively, the via holes 16x and 26x may be formed by using photosensitive resin films as the insulating layers 16 and 26 and patterning them by photolithography. As a further alternative, the via holes 16x and 26x may be formed by patterning resin films to have openings by screen printing.

Then, a metal film 17 is formed on the insulating layer 16 so as to be electrically connected to the exposed portions of the metal film 15 and the exposed portions of the electrode pads 10a. The metal film 17 includes via parts formed to fill the respective via holes 16x and wiring parts formed on the insulating layer 16.

A metal film 27 (signal metal films 27a and radiation metal film 27b) is formed on the insulating layer 26 so as to be electrically connected to the exposed portions of the metal film 25. Like the radiation metal film 15b shown in FIG. 3, the radiation metal film 27b is formed to surround the signal metal films 27a. The signal metal films 27a may be formed so as to coextend with the respective signal metal films 25a of the metal film 25, and the radiation metal film 27b may be formed so as to coextend with the radiation metal film 25b of the metal film 25.

The radiation metal film 27b may be electrically connected to the reference voltage of the semiconductor device 1. The signal metal films 27a are electrically connected to the signal metal films 25a of the metal film 25 through the via holes 26x, respectively. The radiation metal film 27b is electrically connected to the radiation metal film 25b of the metal film 25 through the associated via holes 26x. An example material of the metal film 27 is copper (Cu). The metal films 17 and 27 may be formed by a semi-additive method.

Then, a solder resist layer 18 is formed on the insulating layer 16 so as to cover the metal film 17 and to have openings 18x. And a solder resist layer 28 is formed on the insulating layer 26 so as to cover the metal film 27 and to have openings 28x. For example, the solder resist layer 18 having the openings 18x is formed by applying a solder resist liquid to cover the metal film 17 and exposing to light and developing the applied solder resist liquid. The solder resist layer 28 having the openings 28x may be formed by the same method. The material of the solder resist layers 18 and 28 may be a photosensitive resin composition containing an epoxy resin, an imide resin, or the like.

Portions of the metal film 17 are exposed in the respective openings 18x of the solder resist layer 18, and portions of the signal metal films 27a are exposed in the respective openings 28x of the solder resist layer 28. Metal films (not shown) may be formed on the exposed portions of the metal film 17 and the exposed portions of the signal metal films 27a by electroless plating, for example.

Examples of each of those metal films are an Au film, an Ni/Au film formed by laying an Ni film and an Au film in this order, and an Ni/Pd/Au film formed by laying an Ni film, a Pd film, and an Au film in this order. Instead of forming metal films, OSP (organic solderability preservative) processing may be performed on the exposed portions of the metal film 17 and the exposed portions of the signal metal films 27a.

Then, although not shown in FIG. 11, solder bumps 19 and 29 are formed on the exposed portions of the metal film 17 and the exposed portions of the signal metal films 27a, as external connection terminals for connection to another semiconductor device, a mounting board, or the like. The manufacture of the semiconductor device 1 shown in FIG. 1 is thus completed. For example, the solder bumps 19 are formed by printing solder paste to cover the exposed portions of the metal film 17 and processing solder reflow. The solder bumps 29 may be formed by the same method. Example materials of the solder bumps 19 and 29 are an alloy containing Pb, an alloy of Sn and Cu, an alloy of Sn and Ag, and an alloy of Sn, Ag, and Cu.

Instead of the solder bumps 19 and 29, metal pins, for example, may be used as external connection terminals. The solder bumps 19 and 29, metal pins, or the like to serve as external connection terminals may be omitted. Such external connection terminals may be formed after the semiconductor device 1 has been manufactured, as necessary (e.g., when the semiconductor device 1 is shipped).

Although only a single semiconductor device 1 is illustrated in connection with the above-mentioned manufacturing process, plural semiconductor devices 1 may be formed together and separated into individual ones thereafter.

Although the core substrate 13 having the two through-holes 13x in each of which a semiconductor element 10 is accommodated is illustrated, the core substrate 13 may have one through-hole 13x or three or more through-holes 13x, and a semiconductor element 10 may be accommodated in the one through-hole 13x or each through-hole 13x. Plural semiconductor devices 10 may be accommodated in each through-hole 13x.

Passive components such as capacitors, resistors, and inductors may be accommodated in part of through-holes 13x.

Three or more conductive layers may be formed on the surface 13a or 13b of the core substrate 13.

To increase the heat dissipation further, openings may be formed through the solder resist layer 28 in addition to the openings 28x to expose portions of the radiation metal film 27b of the metal film 27.

As described above, in the first embodiment, the radiation metal film 25b of the metal film 25 is formed continuously/integrally on the back surfaces of the semiconductor elements 10 and on the surface 13b of the core substrate 13 which are approximately flush each other. And, the radiation metal film 25b is connected to the radiation metal film 27b by the via parts of the metal film 27 that penetrate through the insulating layer 26. Furthermore, the part of the radiation metal film 25b and the part of the radiation metal film 15b are connected by the linear conductors 12. As a result, heat that is generated by each semiconductor element 10 during its operation is transmitted from the radiation metal film 25b to the radiation metal film 27b via the via parts of the metal film 27 and also to the radiation metal film 15b via the linear conductors 12. That is, the heat is diffused to and radiated from the entire semiconductor device 1, whereby the element temperature of each semiconductor element 10 can be kept low. In particular, the linear conductors 12 which are formed through the core substrate 13 in its thickness direction at very small intervals cover almost the entire area of the core substrate 13, whereby the heat diffusion and dissipation of the semiconductor device 1 can be enhanced greatly.

The heat diffusion and dissipation of a semiconductor device can be increased without bonding a heat sink or a heat spreader to the back surface of each semiconductor element, thereby preventing reduction in mounting density and realizing miniaturization of a product when semiconductor elements (and other semiconductor devices) are mounted in the semiconductor device.

In the semiconductor device 1, no bumps are used for electrical connections between the semiconductor elements 10 and the metal film 17, thereby preventing stress destruction that is caused by a difference between the thermal expansion coefficients of the semiconductor elements 10 and the metal film 17 and a line disconnection etc. due to electromigration. The reliability of the connections between the semiconductor elements 10 and the metal film 17 can thus be increased.

First Modification of First Embodiment

A first modification of the first embodiment is directed to a semiconductor device 1A which is different from the semiconductor device 1 in the structure of the metal film 25. In the first modification of the first embodiment, the same constituent members etc. as in the first embodiment will not be described in detail.

Figure 12:
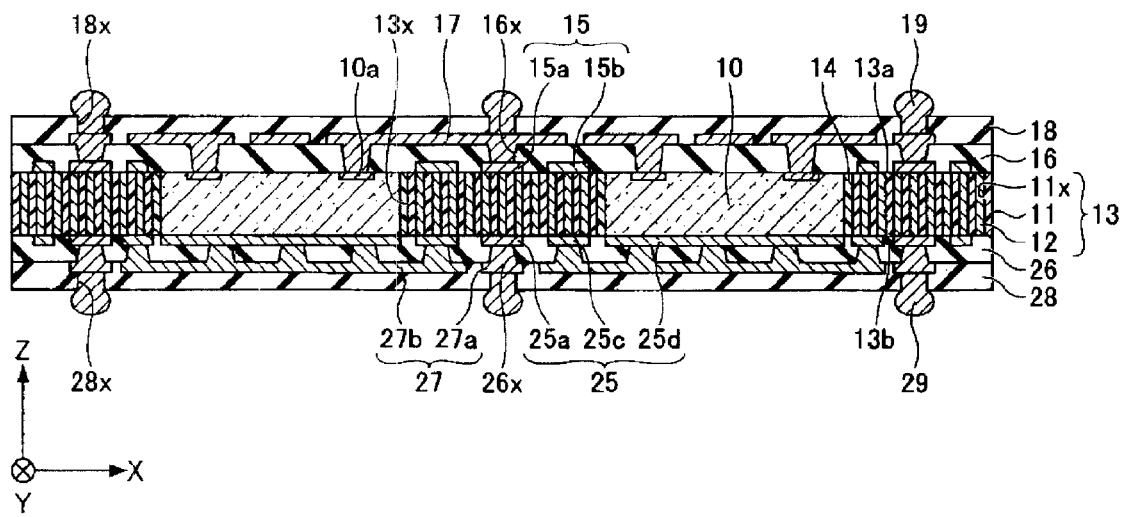
FIG. 12 illustrates a semiconductor device according to a first modification of the first embodiment.

FIG. 12 illustrates the semiconductor device 1A according to the first modification of the first embodiment. As shown in FIG. 12, in the semiconductor device 1A, the metal film 25 has signal metal films 25a which serve as signal flow paths and radiation metal films 25c and 25d which serve as heat radiation paths. Like the radiation metal film 15b shown in FIG. 3, the radiation metal film 25c is formed on the surface 13b of the core substrate 13 to surround the signal metal films 25a. The radiation metal films 25d are formed only on the back surfaces of the semiconductor elements 10.

In the semiconductor device 1 (see FIG. 1), the radiation metal film 25b is formed continuously/integrally on the back surfaces of the semiconductor elements 10 and on the surface 13b of the core substrate 13 which are approximately flush each other. On the other hand, in the semiconductor device 1A, the radiation metal films 25d which are formed on the back surfaces of the semiconductor elements 10 are not continuous with the radiation metal film 25c which is formed on the surface 13b of the core substrate 13. However, the radiation metal film 25c is connected to the radiation metal films 25d via the radiation metal film 27b, whereby heat radiation paths that are similar to the heat radiation paths of the semiconductor device 1 are secured. The radiation metal film 25c functions as the "second metal film", while the radiation metal films 25d function as the "first metal film".

A manufacturing method of the semiconductor device 1A according to the first modification of the first embodiment can be similar to the manufacturing method of the semiconductor device 1 according to the first embodiment.

As described above, in the semiconductor device 1A according to the first modification of the first embodiment, the radiation metal films 25d which are formed on the back surfaces of the semiconductor elements 10 are not continuous with the radiation metal film 25c which is formed on the surface 13b of the core substrate 13. However, since the radiation metal film 25c is connected to the radiation metal films 25d by the other conductive film (radiation metal film 27b), heat radiation paths that are similar to the heat radiation paths of the semiconductor device 1 are secured and the same advantages as in the first embodiment can be obtained.

Second Modification of First Embodiment

A second modification of the first embodiment is directed to a case of using a core substrate having no linear conductors. In the second modification of the first embodiment, the same constituent members etc. as in the first embodiment will not be described in detail.

Figure 13:
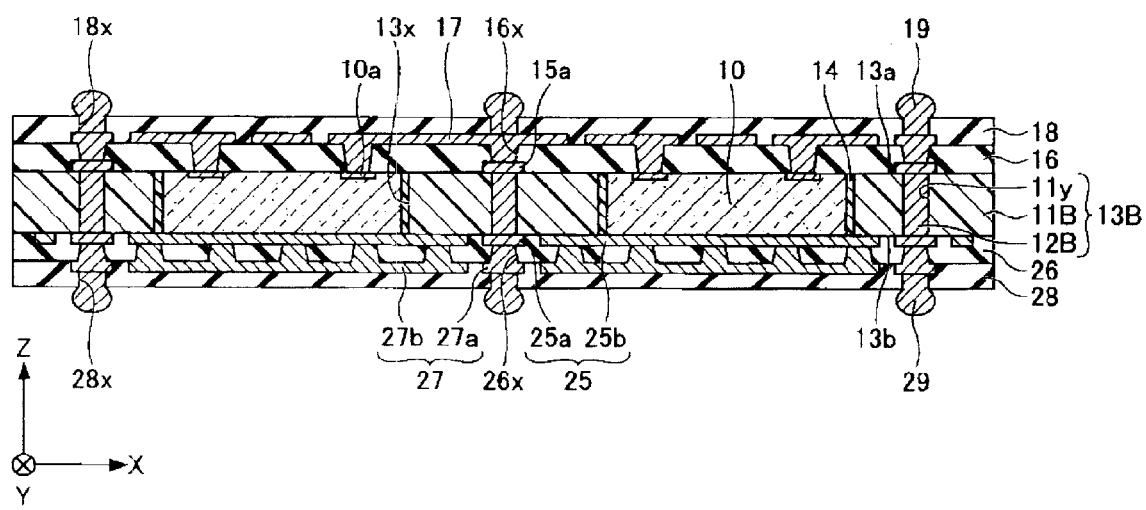
FIG. 13 illustrates a semiconductor device according to a second modification of the first embodiment.

FIG. 13 illustrates a semiconductor device 1B according to the second modification of the first embodiment. As shown in FIG. 13, the semiconductor device 1B is different from the semiconductor device 1 (see FIG. 1) in that the core substrate 13 is replaced by a core substrate 13B.

The core substrate 13B is a substrate that measures, for example, about 70 to 100 µm in thickness and about 30 mm×30 mm in size and has a substrate body 11B and penetration lines 12B. The core substrate 13B is formed with through-holes 13x penetrating therethrough between the surfaces 13a and 13b.

For example, the substrate body 11B may be made of an insulative material such as an organic resin (epoxy resin, polyimide resin, or the like), ceramics, or glass. When the substrate body 11B is made of an organic resin, preferably, the organic resin may be mixed with an inorganic tiller such as silica at a high density. When an inorganic tiller such as silica is mixed at a high density, the thermal expansion coefficient of the substrate body 11B (which is basically made of an organic resin) can be set higher, for example, to be the middle between the thermal expansion coefficient of the semiconductor elements 10 and that of the metal films 15, 17, etc. As a result, stress caused by the difference between the thermal expansion coefficient of the semiconductor elements 10 and that of the metal films 15, 17, etc. can be reduced.

Through-holes 11y are formed through the substrate body 11B. For example, each through-hole 11y is circular in a plan view and about several tens to several hundreds of micrometers in diameter. The penetration lines 12B are formed by filling the respective through-holes 11y with a metal material such as copper (Cu).

Only signal metal films 15a which serve as signal flow paths are formed on the surface 13a of the core substrate 13B. The signal metal films 15a are electrically connected to signal metal films 25a of the metal film 25 by penetration lines 12B, respectively. Like the radiation metal film 15b shown in FIG. 3, a radiation metal film 25b of the metal film 25 is formed to surround the signal metal films 25a. As in the semiconductor device 1, the radiation metal film 25b is formed continuously/integrally on the back surfaces of the semiconductor elements 10 and on the surface 13b of the core substrate 13B which are approximately flush with each other. Alternatively, as in the semiconductor device 1, a radiation metal film 15b to serve as a heat radiation path may also be formed on the surface 13a of the core substrate 13B and connected to the radiation metal film 25b of the metal film 25 by additionally formed penetration lines.

The semiconductor device 1B according to the second modification of the first embodiment can be manufactured by appropriately combining a known manufacturing method.

As described above, in the semiconductor device 1B according to the second modification of the first embodiment, the substrate body 11B is made of an insulative material such as an organic resin, ceramics, or glass. The radiation metal film 25b of the radiation film 25 is formed continuously/integrally on the back surfaces of the semiconductor elements 10 and on the surface 13b of the core substrate 13B which are approximately flush with each other, and the radiation metal film 25b is connected to the radiation metal film 27b by the via parts of the metal film 27 that penetrate through the insulating layer 26. As a result, heat that is generated by each semiconductor element 10 during its operation is transmitted from the radiation metal film 25b to the radiation metal film 27b via the via parts of the metal film 27 and radiated mainly from the side of the surface 13b of the core substrate 13B, whereby the element temperature of each semiconductor element 10 can be kept low. The semiconductor device 1 according to the first embodiment whose core substrate 13 has the linear conductors 12 formed in the thickness direction at very small intervals may be more superior in heat diffusion and dissipation.

Third Modification of First Embodiment

A third modification of the first embodiment is directed to a case of using a core substrate having no linear conductors. In the third modification of the first embodiment, the same constituent members etc. as in the first embodiment will not be described in detail.

Figure 14:
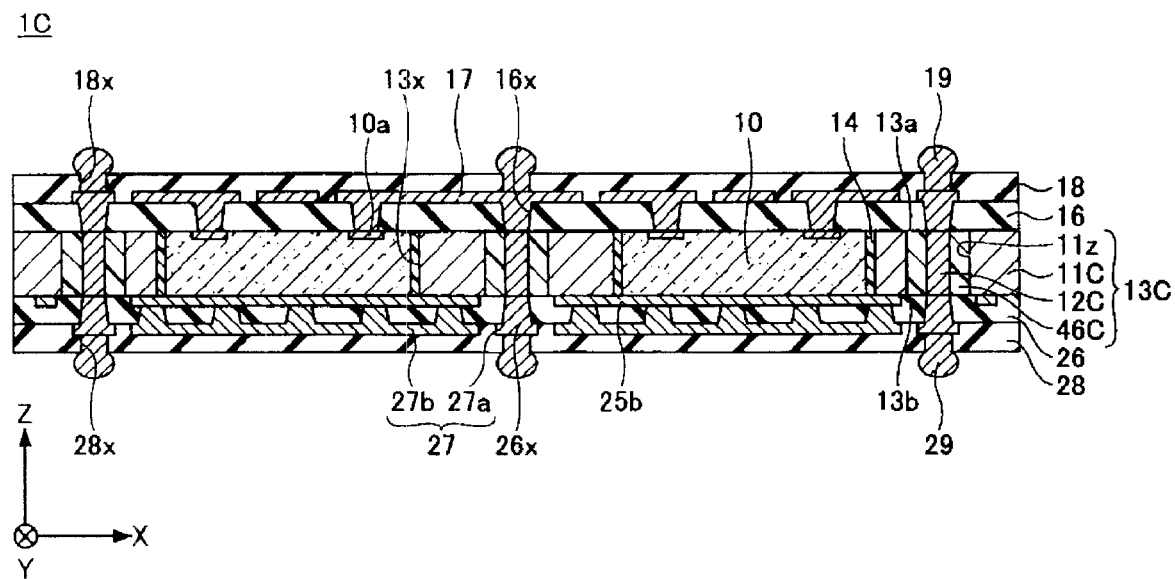
FIG. 14 illustrates a semiconductor device according to a third modification of the first embodiment.

FIG. 14 illustrates a semiconductor device 1C according to the third modification of the first embodiment. As shown in FIG. 14, the semiconductor device 1C is different from the semiconductor device 1 (see FIG. 1) in that the core substrate 13 is replaced by a core substrate 13C.

The core substrate 13C is a substrate that measures, for example, about 70 to 100 μm in thickness and about 30 mm×30 mm in size and has a substrate body 11C, penetration lines 12C, and insulating layers 46C. The core substrate 13C is formed with through-holes 13x penetrating therethrough between the surfaces 13a and 13b.

For example, the substrate body 11C may be made of a conductive material (metal) such as copper (Cu) or aluminum (Al) or a semiconductor such as silicon (Si). Through-holes 11z are formed through the substrate body 11C. For example, each through-hole 11z is circular in a plan view and several tens to several hundreds of micrometers in diameter.

The inner surface of each through-hole 11z is coated with an insulating layer 46C made of an insulative resin or the like and a penetration line 12C is formed inside the insulating layer 46C along the center line of the through-hole 11z. The penetration line 12C may be made of a metal material such as copper (Cu). When the substrate body 11C is made of silicon (Si), insulating films such as thermal oxidation films ($SiO_2$) may be formed on the substrate body 11C including the inner surfaces of the through-holes 11z.

No metal film 15 is formed in the semiconductor device 1C. The penetration lines 12C electrically connect the metal film 17 to the signal metal films 27a of the metal film 27. Like the radiation metal film 15b shown in FIG. 3, a radiation metal film 25b of the metal film 25 is formed to surround the signal metal films 25a. As in the semiconductor device 1, a radiation metal film 25b is formed continuously/integrally on the back surfaces of the semiconductor elements 10 and on the surface 13b of the core substrate 10C which are approximately flush with each other.

The semiconductor device 1C according to the third modification of the first embodiment can be manufactured by appropriately combining a known manufacturing method.

As described above, in the semiconductor device 1C according to the third modification of the first embodiment, the substrate body 11C is made of a conductive material such as copper (Cu) or aluminum (Al). The radiation metal film 25b of the radiation film 25 is formed continuously/integrally on the back surfaces of the semiconductor elements 10 and on the surface 13b of the core substrate 13C which are approximately flush with each other, and the radiation metal film 25b is connected to the radiation metal film 27b by the via parts of the metal film 27 that penetrate through the insulating layer 26. As a result, heat that is generated by each semiconductor element 10 during its operation is transmitted from the radiation metal film 25b to the radiation metal film 27b via the via parts of the metal film 27 and also to the side of the surface 13a via the substrate body 11C. The transmitted heat is radiated from the entire semiconductor device 1C, whereby the element temperature of each semiconductor element 10 an be kept low.

Fourth Modification of First Embodiment

In a fourth modification of the first embodiment, the heat diffusion and dissipation are made even higher than the first embodiment. In the fourth modification of the first embodiment, the same constituent members etc. as in the first embodiment will not be described in detail.

Figure 15:
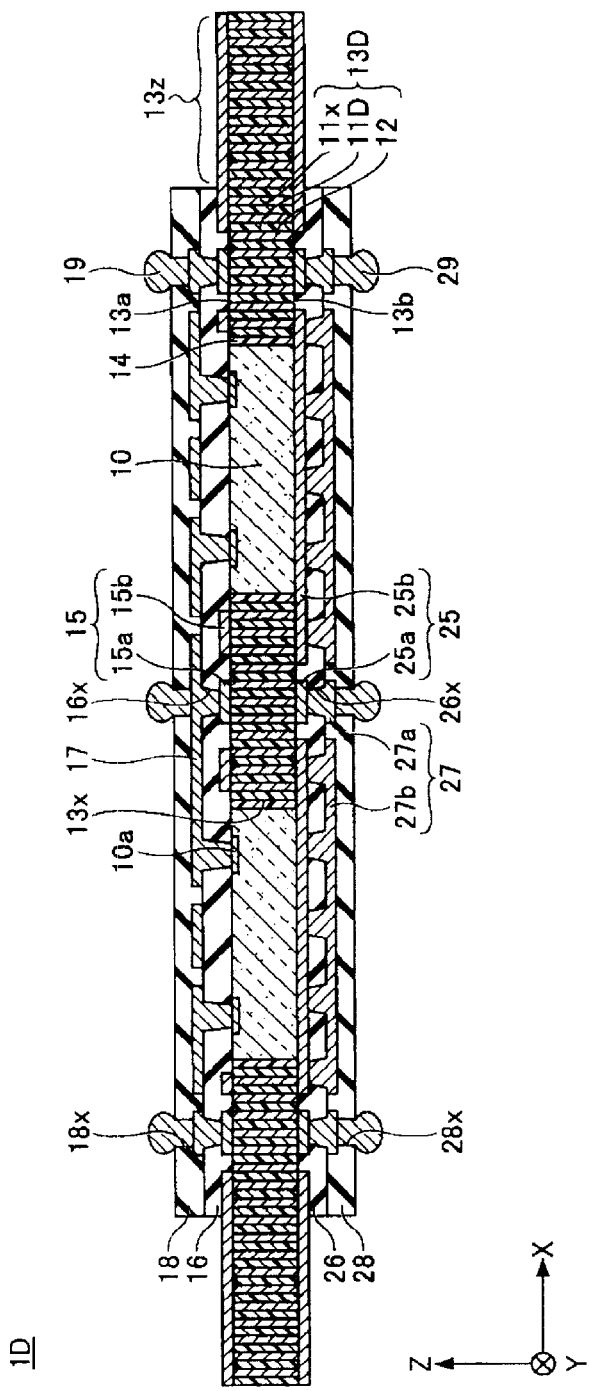
FIGS. 15 and 16 illustrate semiconductor devices according to a fourth modification of the first embodiment, respectively.

FIG. 15 illustrates a semiconductor device 1D according to the fourth modification of the first embodiment. As shown in FIG. 15, the semiconductor device 1D is different from the semiconductor device 1 (see FIG. 1) in that the core substrate 13 is replaced by a core substrate 13D.

In the semiconductor device 1D, a substrate body 11D is larger in a plan view than the substrate body 11 of the semiconductor device 1 and the insulating layers such as the insulating layers 16 and 26 do not extend so as to cover a peripheral portion 13z of the core substrate 13D. The peripheral portion 13z of the core substrate 13D may be shaped like a picture frame in a plan view. The width in the X direction of the peripheral portion 13z of the core substrate 13D may be about 1 to 5 mm.

A radiation metal film 15b of the metal film 15 on the surface 13a of the core substrate 13D extends over the peripheral portion 13z. A radiation metal film 25b of the metal film 25 on the surface 13b of the core substrate 13D extends over the peripheral portion 13z. The extended portion of the radiation metal film 15b and the extended portion of the radiation metal film 25b are connected to each other by the linear conductors 12 in the peripheral portion 13z.

Figure 16:
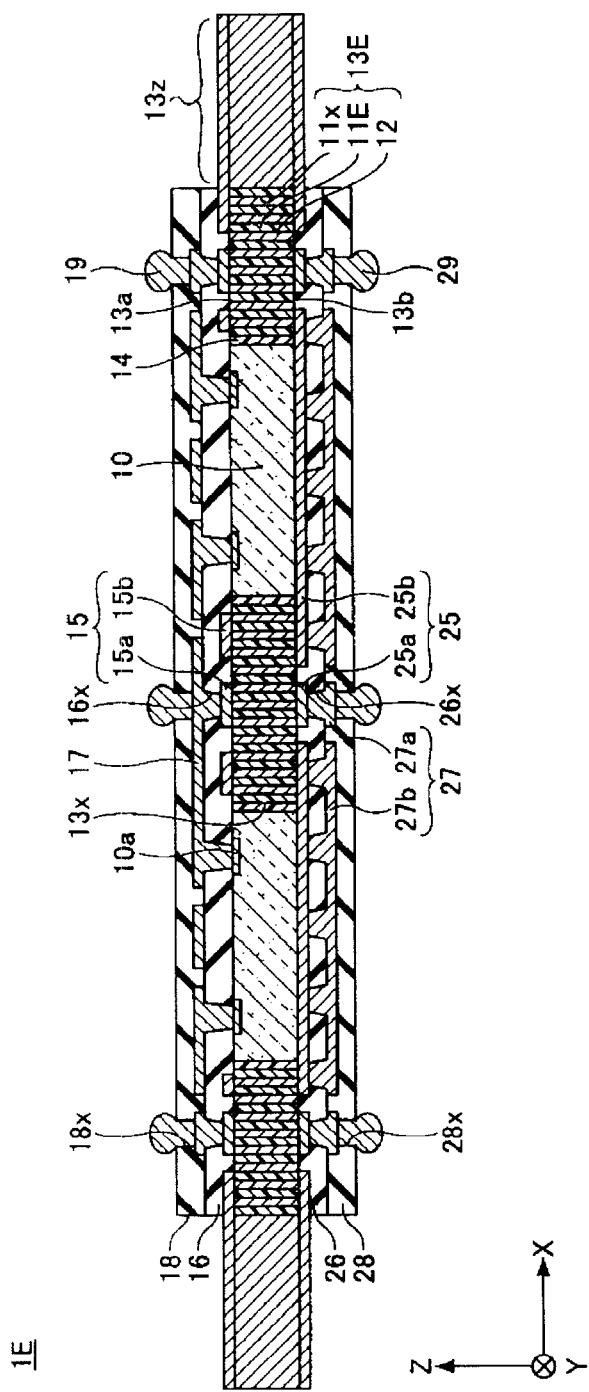

FIG. 16 shows another semiconductor device 1E in which linear conductors 12 are not provided in a portion of a substrate body 11E corresponding to a peripheral portion 13z of the core substrate 13E. In this case, the peripheral portion 13z may be made of aluminum (Al), for example. This core substrate 13E may be formed by masking the peripheral portion 13z when forming through-holes 11x by anodic oxidation, for example, in the manufacturing step of FIG. 4.

Figure 17A:
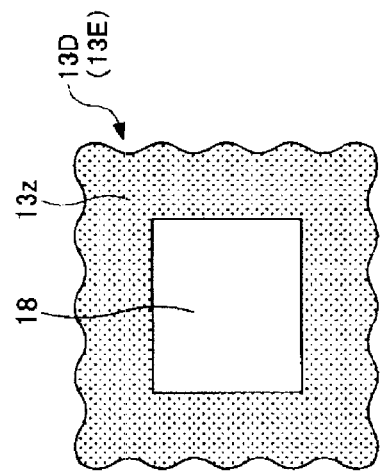
FIGS. 17A-17C illustrate plan-view shapes of the side surfaces of core substrates of semiconductor devices according to the fourth modification of the first embodiment.
Figure 17B:
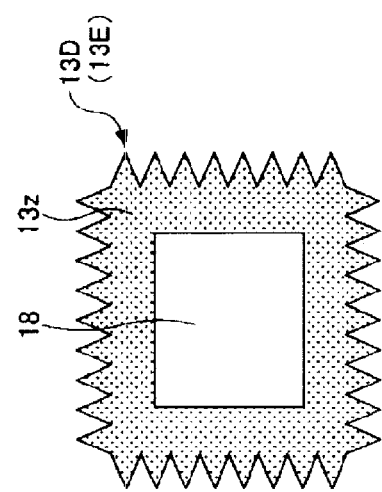
Figure 17C:
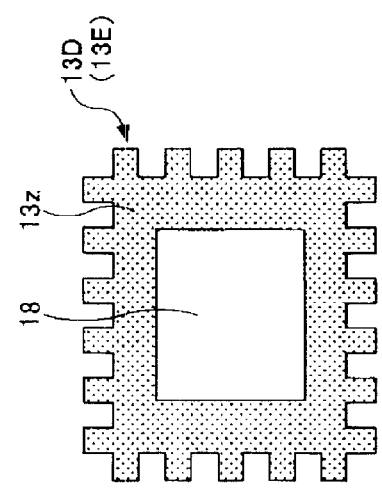

As shown in FIGS. 15 and 16, the side surfaces of the peripheral portion 13z of the core substrate 13D or 13E may be projected and recessed continuously in a plan view, so as to increase the total surface area and to thereby increase the heat dissipation. In FIGS. 17A-17C, the peripheral portion 13z of the core substrate 13D or 13E is dotted. The side surfaces of the peripheral portion 13z of the core substrate 13D or 13E may be shaped like a rectangular wave (FIG. 17A), a triangular wave (FIG. 17B), a sinusoidal wave (FIG. 17C), or the like.

As described above, in the semiconductor devices 1D and 1E according to the fourth modification of the first embodiment, the insulating layers such as the insulating layers 16 and 26 do not extend so as to cover the peripheral portion 13z so that the radiation metal films 15b and 25b are exposed. As a result, the surfaces of the peripheral portion 13z serve as heat radiation surfaces, and heat can be radiated efficiently from the peripheral portion 13z. Thus, the heat dissipation of each of the semiconductor devices 1D and 1E can be made higher, as compared with the semiconductor device 1.

The configurations of the semiconductor devices 1D and 1E are effective also in the case where the substrate body 11D or 11E is made of a conductive material (metal) such as copper (Cu) or aluminum (Al).

Second Embodiment

A second embodiment is directed to a semiconductor device 2 in which plural semiconductor devices 1 are stacked. The same constituent members etc. as in the first embodiment will not be described in detail. And, constituent members etc. that are different than the first embodiment will mainly be described below.

Figure 18:
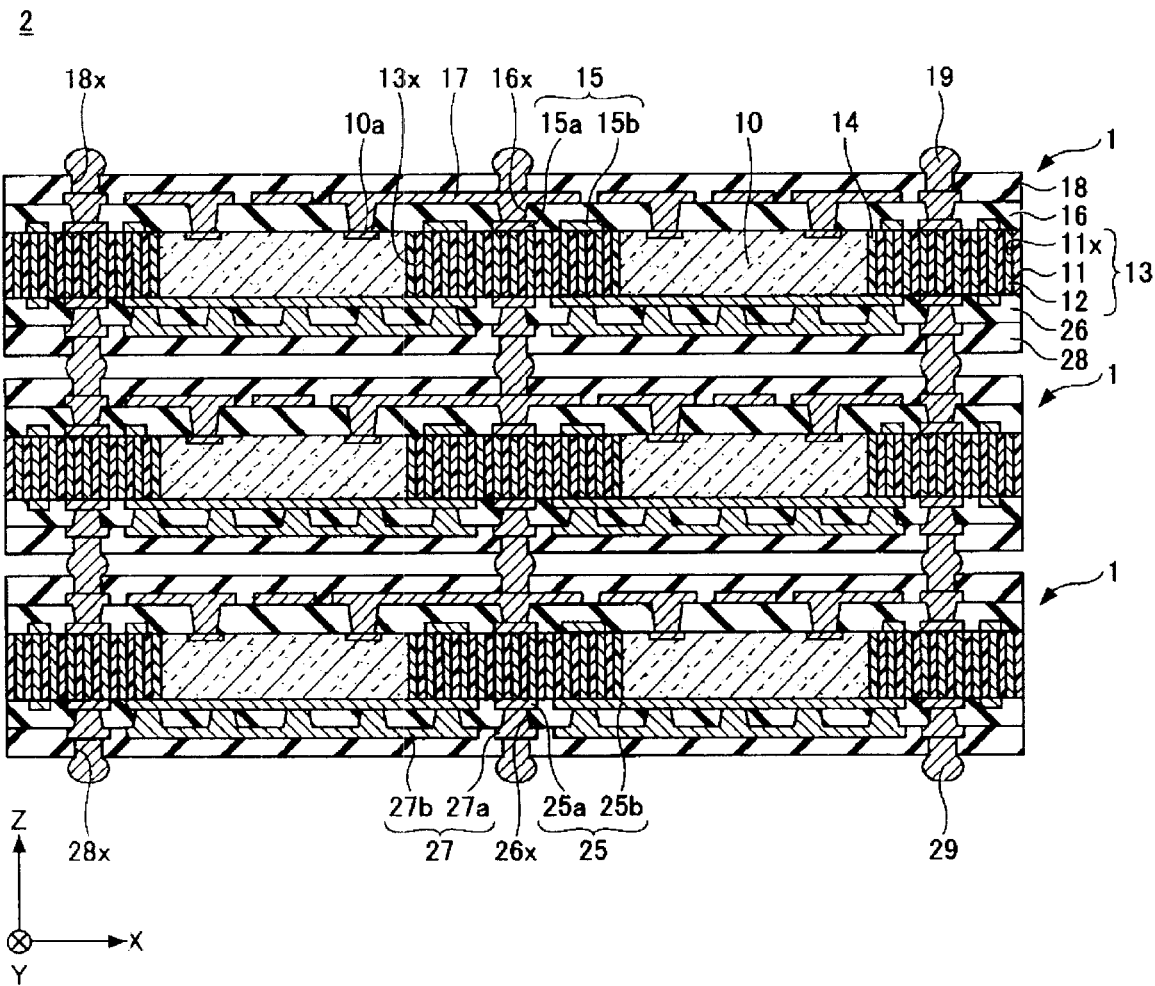
FIG. 18 cross-sectionally illustrates a semiconductor device according to a second embodiment.

FIG. 18 cross-sectionally illustrates the semiconductor device 2 according to the second embodiment. As shown in FIG. 18, in the semiconductor device 2, plural semiconductor devices 1 (see FIG. 1) according to the first embodiment are stacked.

In the semiconductor device 2, three semiconductor devices 1 are stacked and adjoining semiconductor devices 1 are connected to each other by the solder bumps 19 and the solder bumps 29 that are adjacent to each other in the vertical direction. The number of semiconductor devices 1 stacked is not limited to three and may be two or four or more.

A manufacturing method of the semiconductor device 2 according to the second embodiment is the manufacturing method of the semiconductor device 1 according to the first embodiment plus a known manufacturing process for stacking plural semiconductor devices 1, for example.

The second embodiment provides the following advantage in addition to the advantages of the first embodiment. Since in each semiconductor device 1 no heat sink or heat spreader is bonded to the back surface of each semiconductor element 10, plural semiconductor devices 1 can be stacked easily in the second embodiment. Since the heat diffusion and dissipation of each semiconductor devices 1 are high even without bonding a heat sink or a heat spreader to the back surface of each semiconductor element 10, the mounting density can also be increased in the second embodiment.

First Modification of Second Embodiment

In a first modification of the second embodiment, the heat diffusion and dissipation are made even higher than the second embodiment. In the first modification of the second embodiment, the same constituent members etc. as in the first embodiment will not be described in detail.

Figure 19:
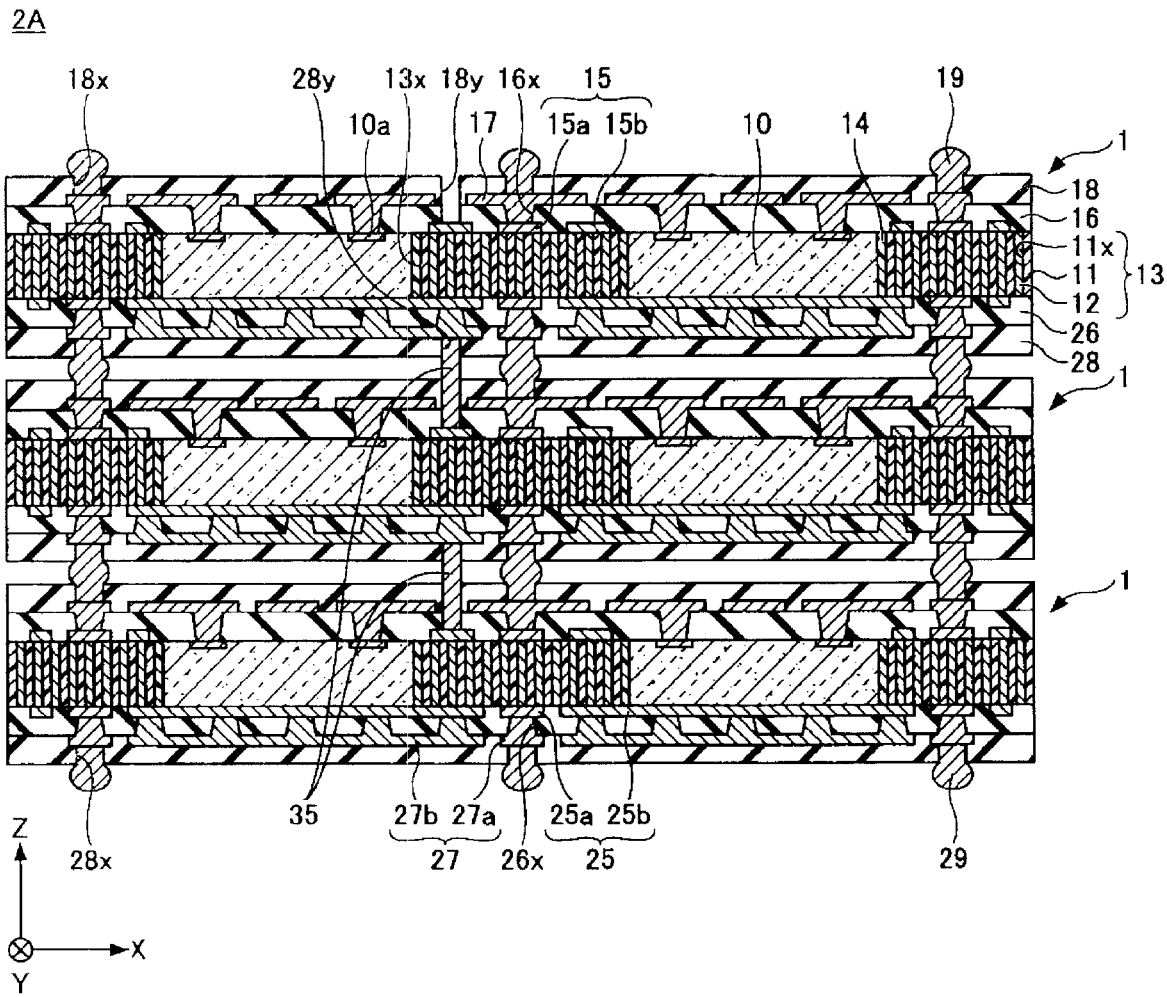
FIG. 19 illustrates a semiconductor device according to a first modification of the second embodiment.

FIG. 19 illustrates a semiconductor device 2A according to the first modification of the second embodiment. As shown in FIG. 19, the semiconductor device 2A according to the first modification of the second embodiment is different from the semiconductor device 2 (see FIG. 18) in that radiation metal films 15b and 27b that are adjacent to each other in the vertical direction are connected to each other by a metal post 35.

In the semiconductor device 2A, each semiconductor device 1 is formed with openings 18y and 28y. The opening 18y penetrates through the insulating layer 16 and the solder resist layer 18 and exposes a portion of the radiation metal film 15b of the metal film 15. The opening 28y penetrates through the solder resist layer 28 and exposes a portion of the radiation metal film 27b of the metal film 27.

One end portion of each metal post 35 is inserted in the opening 18y and connected to the exposed portion of the radiation metal film 15b with solder or the like (not shown). The other end portion of the metal post 35 is inserted in the opening 28y that is adjacent to the opening 18y in the vertical direction (Z direction) and connected to the exposed portion of the radiation metal film 27b with solder or the like (not shown). The metal posts 35 may be made of a metal having superior heat conductivity, such as copper. The metal posts 35 may be formed by using a known method. For example, the metal posts 35 may be previously prepared. In stead of the metal posts 35, solder bumps may be used.

As described above, in the semiconductor device 2A according to the first modification of the second embodiment, radiation metal films 15b and 27b that are adjacent to each other in the vertical direction are connected to each other by a metal post 35. Since the metal posts 35 serve as portions of heat radiation paths, the heat diffusion and dissipation can be made even higher than the semiconductor device 2.

Second Modification of Second Embodiment

In a second modification of the second embodiment, the heat diffusion and dissipation are made even higher than the second embodiment. In the second modification of the second embodiment, the same constituent members etc. as in the first embodiment will not be described in detail.

Figure 20:
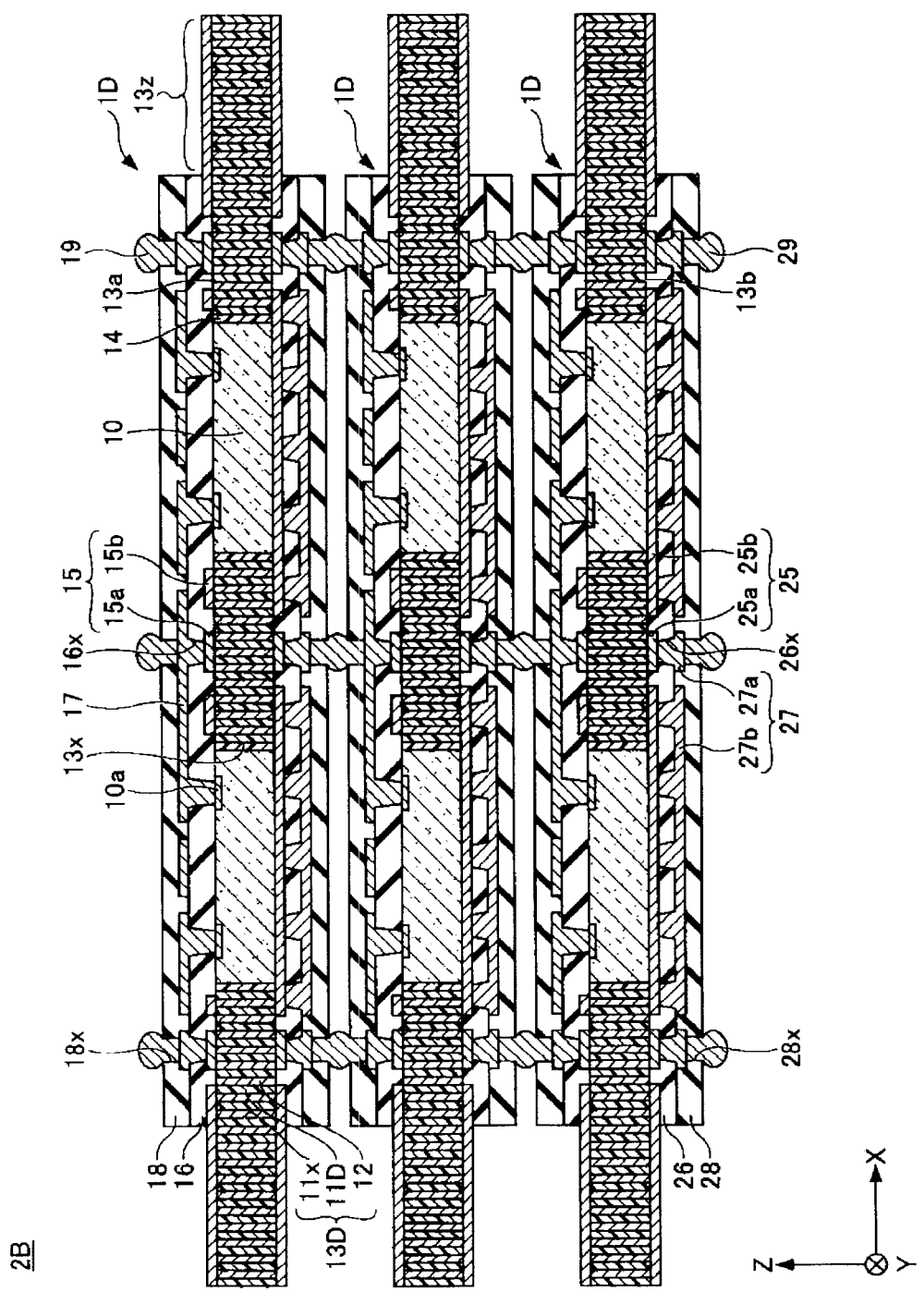
FIG. 20 illustrates a semiconductor device according to a second modification of the second embodiment.

FIG. 20 illustrates a semiconductor device 2B according to the second modification of the second embodiment. As shown in FIG. 20, the semiconductor device 2B according to the second modification of the second embodiment is different from the semiconductor device 2 (see FIG. 18) in that plural semiconductor devices 1D shown in FIG. 15 are stacked.

Plural semiconductor devices 1D in which the insulating layers such as the insulating layers 16 and 26 do not extend so as to cover the peripheral portion 13z and the radiation metal films 15b and 25b are exposed in the peripheral portion 13z are stacked, whereby the peripheral portions 13z of the stacked core substrates 13D are arranged in the vertical direction and serve as heat radiation fins. As a result, the heat diffusion and dissipation of the semiconductor device 2B can be made even higher than those of the semiconductor device 2.

As described above, in the semiconductor device 2B according to the second modification of the second embodiment, since the peripheral portions 13z of the stacked core substrates 13D serve as heat radiation fins, the heat dissipation can be made even higher than the semiconductor device 2. The same advantages can be obtained by stacking plural semiconductor devices 1E shown in FIG. 16. The heat dissipation can further be increased by combining the semiconductor device 2B with any of the structures shown in FIG. 17.

The configuration of the semiconductor device 2B is effective also in the case where the substrate body 11D is made of a conductive material (metal) such as copper (Cu) or aluminum (Al).

Although the embodiments and their modifications are exemplified, the invention should not be limited thereto, and various changes and replacements can be made in the above embodiments and modifications within the scope of the invention.

For example, the embodiments and modifications may be appropriately combined.

The invention claimed is:

1. A semiconductor device comprising:
a core substrate having a first surface and a second surface, a semiconductor element accommodation hole penetrating through the core substrate between the first surface and the second surface;
a semiconductor element accommodated in the semiconductor element accommodation hole so that a circuit formation surface thereof is on the first surface side;
a first metal film formed directly on a back surface of the semiconductor element, the back surface being opposite to the circuit formation surface;
a second metal film formed directly on the second surface of the core substrate, the second metal film disposed outwardly of the first metal film;
an insulating layer formed to cover the first metal film and the second metal film; and
a third metal film formed on the insulating layer, the third metal film having via parts that penetrate through the insulating layer and respectively reach the first metal film and the second metal film to thereby connect the first metal film and the second metal film.

2. The semiconductor device of claim 1,
wherein the first metal film and the second metal film are integrally formed with each other.

3. The semiconductor device of claim 1,
wherein the core substrate has an insulative substrate made of a material including an inorganic dielectric and a plurality of linear conductors penetrating through the insulative substrate between both surfaces thereof, and
wherein a part of the linear conductors are connected to the second metal film.

4. The semiconductor device of claim 3, further comprising:
a fourth metal film formed on the first surface of the core substrate so as to be connected with the second metal film by a corresponding part of the linear conductors.

5. The semiconductor device of claim 1,
wherein a portion of the second metal film extends over a peripheral portion of the core substrate, said portion of the second metal film overlays the peripheral portion of the core substrate and is not covered with or overlaid by the insulating layer.

6. The semiconductor device of claim 5,
wherein side surfaces of the core substrate are projected and recessed continuously in a plan view.

7. The semiconductor device of claim 1,
wherein the metal films constitute a heat radiation path.

8. A semiconductor device comprising plural semiconductor devices of claim 1 which are stacked and electrically connected to each other.

9. The semiconductor device of claim 8,
wherein adjoining metal films of adjoining ones of the plural stacked semiconductor devices are connected to each other by a metal post.

10. The semiconductor device of claim 1,
wherein the first metal film is disposed between the third metal film and the back surface of the semiconductor element, and the second metal film is disposed between the third metal film and the second surface of the core substrate.

11. The semiconductor device of claim 10,
wherein the third metal film is formed on the second surface side of the core substrate and the back surface side of the semiconductor element.

12. The semiconductor device of claim 11,
wherein the insulating layer is formed on the second surface side of the core substrate and the back surface side of the semiconductor element, and is disposed between the third metal film and the second surface of the core substrate and the back surface of the semiconductor element.

13. The semiconductor device of claim 10,
wherein the insulating layer covers and directly contacts the first metal film and the second metal film, the third metal film is formed directly on the insulating layer, and the insulating layer is disposed between the third metal film and the second surface of the core substrate and the back surface of the semiconductor element.

14. The semiconductor device of claim 13,
wherein the core substrate has an insulative substrate made of a material including an inorganic dielectric and a plurality of linear conductors penetrating through the insulative substrate between both surfaces thereof,
wherein a part of the linear conductors are connected to the second metal film, and
wherein the semiconductor device further comprises a fourth metal film formed directly on the first surface of the core substrate so as to be connected with the second metal film by a corresponding part of the linear conductors.

15. A semiconductor device comprising:
a core substrate having a first surface and a second surface, a semiconductor element accommodation hole penetrating through the core substrate between the first surface and the second surface;
a semiconductor element accommodated in the semiconductor element accommodation hole so that a circuit formation surface thereof is on the first surface side;
a first metal film formed directly on a back surface of the semiconductor element, the back surface being opposite to the circuit formation surface;
a second metal film formed directly on a first portion of the second surface of the core substrate, wherein a second portion of the second surface of the core substrate is exposed from the second metal film, and the second metal film is disposed outwardly of the first metal film; and
an insulating layer formed to cover the first metal film and the second metal film,
wherein the first metal film and the second metal film are integrally formed with each other.

16. The semiconductor device of claim 15,
wherein the second portion of the second surface of the core substrate is covered by the insulating layer.

17. The semiconductor device of claim 15, further comprising:
a third metal film formed on the insulating layer, the third metal film having via parts that penetrate through the insulating layer and respectively reach the first metal film and the second metal film to thereby connect the first metal film and the second metal film,
wherein the first metal film is disposed between the third metal film and the back surface of the semiconductor element, and the second metal film is disposed between the third metal film and the second surface of the core substrate.

* * * * *